United States Patent
Shimooka

(10) Patent No.: US 8,271,917 B2
(45) Date of Patent: Sep. 18, 2012

(54) STATIC VERIFICATION PROGRAM, STATIC VERIFICATION DEVICE, AND STATIC VERIFICATION METHOD

(75) Inventor: Masaaki Shimooka, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/158,991

(22) Filed: Jun. 13, 2011

(65) Prior Publication Data
US 2011/0307851 A1 Dec. 15, 2011

(30) Foreign Application Priority Data

Jun. 14, 2010 (JP) ................... 2010-135361

(51) Int. Cl.
G06F 9/455 (2006.01)
G06F 17/50 (2006.01)
(52) U.S. Cl. ........ 716/106; 716/104; 716/108; 716/111; 716/136
(58) Field of Classification Search .................. 716/104, 716/106, 108, 111, 136
See application file for complete search history.

(56) References Cited

U.S. PATENT DOCUMENTS

| | | | |
|---|---|---|---|
| 8,037,436 B2 * | 10/2011 | Kumazaki | 716/111 |
| 2010/0175036 A1 * | 7/2010 | Mochizuki | 716/5 |
| 2010/0223584 A1 * | 9/2010 | Baumgartner et al. | 716/6 |
| 2011/0225559 A1 * | 9/2011 | Nishide | 716/106 |

FOREIGN PATENT DOCUMENTS

JP 2005-196681 A 7/2005

OTHER PUBLICATIONS

Masahiro Fujita, "[Invited Talk] SAT algorithms and their application to formal verification", IEICE Technical Report, Nov. 2006, pp. 15-20, vol. 106, Nos. 388, 391 and 393, The Institute of Electronics, Information and Communication Engineers.

* cited by examiner

*Primary Examiner* — Jack Chiang
*Assistant Examiner* — Brian Ngo
(74) *Attorney, Agent, or Firm* — Sughrue Mion, PLLC

(57) ABSTRACT

A static verification program according to the present invention reads a circuit description and property. In a static verification step, static verification of the circuit description is performed on the basis of the property and the number of states that can be reached and the number of states that is reached are calculated. In a search coverage value calculation step, a search coverage value is calculated on the basis of the number of states that can be reached and the number of states that is reached. In a display step, the search coverage value is displayed in a state in which the search coverage value can be visually checked.

9 Claims, 7 Drawing Sheets

STATIC VERIFICATION PROGRAM, STATIC VERIFICATION DEVICE, AND STATIC VERIFICATION METHOD

CROSS-REFERENCES TO RELATED APPLICATIONS

The disclosure of Japanese Patent Application No. 2010-135361 filed on Jun. 14, 2010 including the specification, drawings and abstract is incorporated herein by reference in its entirety.

BACKGROUND

The present invention relates to a static verification program, a static verification device, and a static verification method, and in particular to a static verification program, a static verification device, and a static verification method applied to verify operation of an integrated circuit.

Static verification is used as a technique for verifying operation of a circuit in a design of a large scale integrated circuit. As design verification workload increases in recent years, the static verification is regarded as indispensable. The static verification is a verification technique for mathematically verifying that described specification property (assertion) satisfies a design specification.

In the static verification, search is performed for all reachable state spaces that can be created by a state variable described in the specification property, and it is verified that the specification property is satisfied in each state space (Japanese Unexamined Patent Application Publication No. 2005-196681). Therefore, the static verification is better than logic simulation in terms of exhaustive verification.

In an actual EDA tool, as a static verification method, a symbolic model checking method is used (Masahiro Fujita, "[Special Lecture] SAT algorithm and its application on formal verification", IEICE Technical Report, The Institute of Electronics, Information and Communication Engineers, November 2006, Vol. 106, No. 388, 391, 393, pp. 15-20). The symbolic model checking method is a method in which a state set and a state transition are symbolically represented by mathematical formulas and state search is performed by processing these formulas. In the symbolic model checking method, a certain state set is calculated as a product of a state set of the previous cycle and its state transition. Since the above operation is logic function processing, all operations can be processed as a BDD (Binary decision diagram) calculation or a SAT problem.

However, an amount of calculation in the static verification is greater than that in the logic simulation. Therefore, a huge calculation time is required depending on the scale of the circuit to be verified, so that it may prolong the verification time. Thus, a method is used in which an execution time limit of the static verification is set, and if the time limit is reached while verification result cannot be obtained, the static verification is forcibly terminated. To be exact, the verification is performed only on states that can be reached within the number of state transition cycles (search depth) that can be performed in a processing time (bounded model checking).

SUMMARY

However, if the static verification is forcibly terminated, verification result cannot be obtained. In other words, it is not possible to check whether or not the circuit to be verified satisfies the specification property, and further it is not possible to check how far the verification has progressed. An existing EDA tool only displays the number of transition clock cycles (search depth) that can be verified in time.

Therefore, it is not possible to determine whether or not the circuit to be verified should be modified. In addition, even when trying to change a restrictive condition and re-perform the static verification, it is not possible to obtain information for determining how to modify the restrictive condition. As a result, if the static verification is forcibly terminated, useful information cannot be obtained, and this causes loss of time and cost.

According to an aspect of the present invention, a non-transitory computer readable medium storing a static verification program causes a computer to execute a process for static verification, the process includes: reading a circuit description and property; performing static verification of the circuit description on the basis of the property and calculating the number of states that can be reached in the static verification and the number of states that is reached in accordance with a search depth in the static verification; calculating a search coverage value on the basis of the number of states that can be reached and the number of states that is reached; and displaying the search coverage value in a state in which the search coverage value can be visually checked. The static verification program according to an aspect of the present invention calculates the search coverage value in accordance, with the search depth in the static verification. Therefore, a user can know the progress state of the static verification.

According to another aspect of the present invention, a static verification device includes: a storage unit that stores a circuit description and property; a static verification unit that performs static verification of the circuit description on the basis of the property and calculates the number of states that can be reached in the static verification and the number of states that is reached in accordance with a search depth in the static verification; a search coverage value calculator that calculates a search coverage value on the basis of the number of states that can be reached and the number of states that is reached; and a display unit that displays the search coverage value in a state in which the search coverage value can be visually checked with respect to the search depth. The static verification device according to the aspect of the present invention calculates the search coverage value in accordance with the search depth in the static verification. Therefore, user can know the progress state of the static verification.

According to another aspect of the present invention, a static verification method includes: reading a circuit description and property stored in a storage unit, performing static verification of the circuit description on the basis of the property, and calculating the number of states that can be reached in the static verification and the number of states that is reached in accordance with a search depth in the static verification; calculating a search coverage value on the basis of the number of states that can be reached and the number of states that is reached; and displaying the search coverage value in a state in which the search coverage value can be visually checked with respect to the search depth. The static verification method according to the aspect of the present invention calculates the search coverage value in accordance with the search depth in the static verification. Therefore, a user can know the progress state of the static verification.

According to the present invention, it is possible to provide a static verification program, a static verification device, and a static verification method in which the progress state of the static verification can be known.

DETAILED DESCRIPTION

First Embodiment

Figure 1:
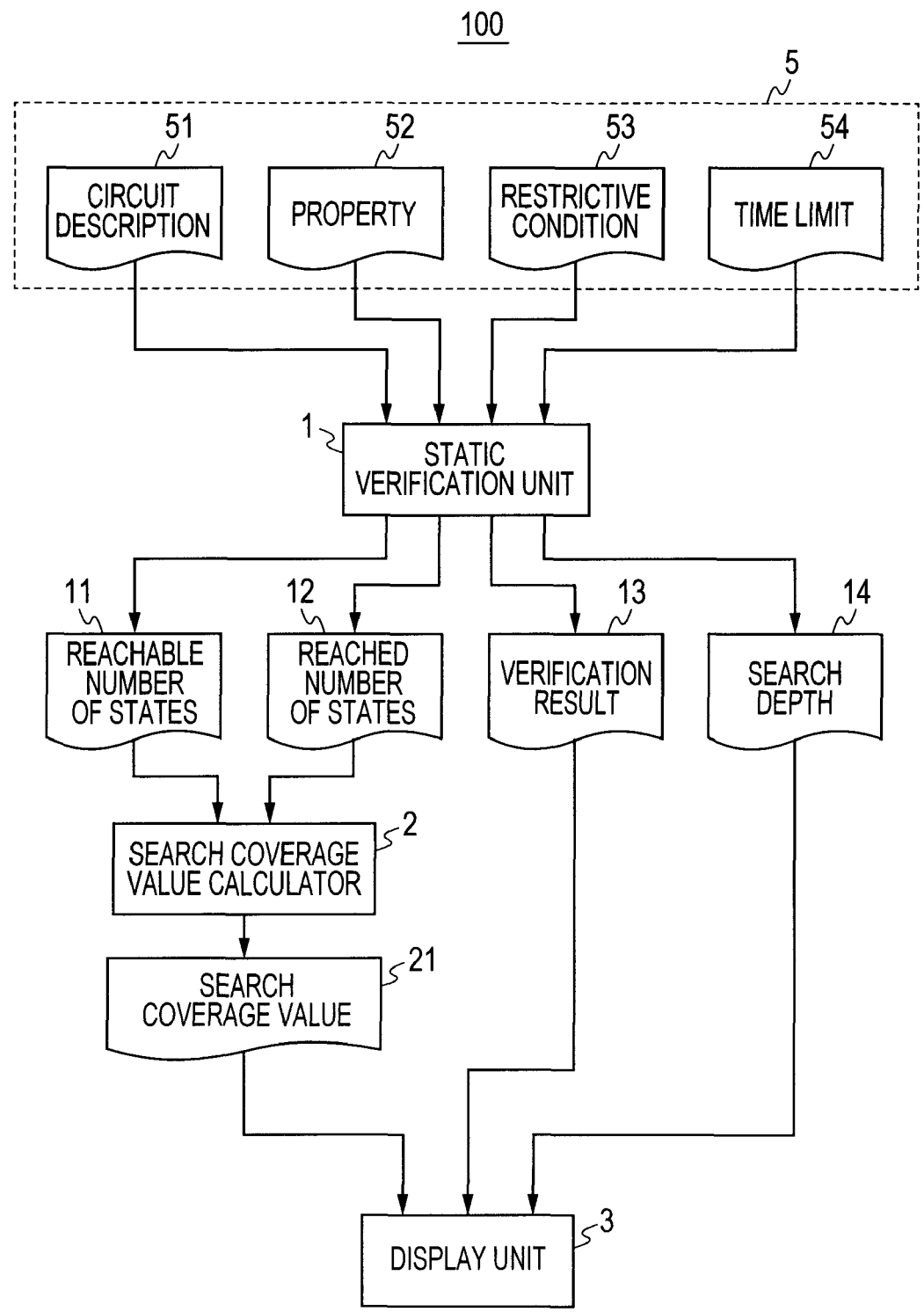
FIG. 1 is a configuration diagram of a static verification device according to a first embodiment.

Hereinafter, embodiments of the present invention will be described with reference to the drawings. A static verification device according to the first embodiment is a device that performs static verification as operation verification of a given circuit description. FIG. 1 is a configuration diagram of the static verification device 100 according to the first embodiment. As shown in FIG. 1, the static verification device 100 includes a static verification unit 1, a search coverage value calculator 2, and display unit 3.

The static verification unit 1 performs static verification on a circuit description 51 on the basis of property 52, a restrictive condition 53, and a time limit 54. For example, the circuit description 51, the property 52, the restrictive condition 53, and the time limit 54 are stored in a storage unit 5 and read by the static verification unit 1. The circuit description 51 is a circuit description in which a logic configuration of an integrated circuit is described and which is a verification target of the static verification. The circuit description 51 is provided as a logic circuit model described in, for example, RTL (Register Transfer Level) description. The property 52 is property made from a required logic specification.

The restrictive condition 53 is a restriction for limiting a state space verified when the static verification is performed to a necessary minimum. For example, the restrictive condition 53 includes conditions such as, setting input terminals to fixed values, properties that are already verified to be true, and a circuit specification specifying that input is stopped when FIFO is full.

The time limit 54 is set to limit the execution time of the static verification. If verification result cannot be obtained even after the time limit 54 has elapsed since the start of the static verification, the static verification unit 1 forcibly terminates the static verification.

The static verification unit 1 outputs a reachable number of states 11 that can be reached in the static verification. The static verification unit 1 also outputs a reached number of states 12 and a search depth 14 in accordance with a search depth of the static verification. Further, the static verification unit 1 outputs a verification result 13 when a verification result is obtained.

The search coverage value calculator 2 calculates a search coverage value 21 on the basis of the reachable number of states 11 and the reached number of states 12. The calculation of the search coverage value 21 by the search coverage value calculator 2 can be performed in real time according to the search depth of the static verification. When the static verification is forcibly terminated, the search coverage value calculator 2 calculates the search coverage value 21 according to the search depth at the time of forced termination. Then the search coverage value calculator 2 outputs the calculated search coverage value 21 to the display unit 3. The search coverage value calculator 2 can make a graph of the calculated search coverage value 21 with respect to the search depth and output the graph to the display unit 3.

The search coverage value 21 is a value obtained by dividing the reached number of states m that is reached in a verification process by the reachable number of states N that can be reached in a circuit description to be verified. Namely, a value C of the search coverage value 21 is represented by the following formula (1).

$$C = m/N \qquad (1)$$

The verification result 13 and the search depth 14 are inputted into the display unit 3 from the static verification unit 1. The search coverage value 21 is inputted into the display unit 3 from the search coverage value calculator 2. The display unit 3 displays a verification result of the static verification and a progress state of the static verification (the search depth 14 and the search coverage value 21) in accordance with the inputted information. The display unit 3 can display the graph of the search coverage value 21 with respect to the search depth, which is made by the search coverage value calculator 2.

Figure 2:
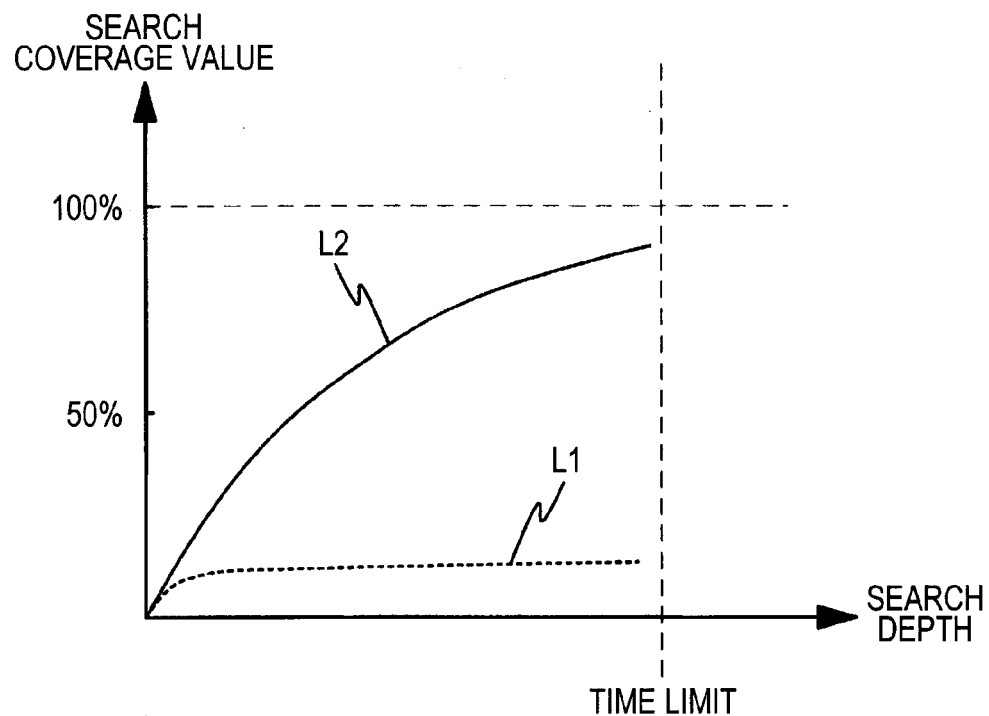
FIG. 2 is a diagram showing an example of a graph displayed on a display unit.

A user of the static verification device 100 can know the search coverage value with respect to the search depth of the static verification by checking the display described above. FIG. 2 is a diagram showing an example of the graph displayed on the display unit 3. The curve L1 indicates a case in which the search coverage value is saturated shortly after the start of the verification. The curve L2 indicates a case in which the search coverage value tends to increase.

In the curve L1, the search coverage value is saturated shortly after the start of the verification. At this time, user can perform efficient static verification by investigating the cause of the saturation, re-setting the restrictive condition 53, and re-performing the static verification.

In the curve L2, the search coverage value is not saturated event when the time limit 54 is reached. Therefore, the user determines that the verification proceeds smoothly, so that the user can extend the time limit and re-perform the static verification, and thereby the user can expect verification of a higher degree of accuracy.

In summary, according to the static verification device 100, a user of the static verification device 100 can observe the progress state of the static verification by referring to the search coverage value of the static verification.

Figure 3:
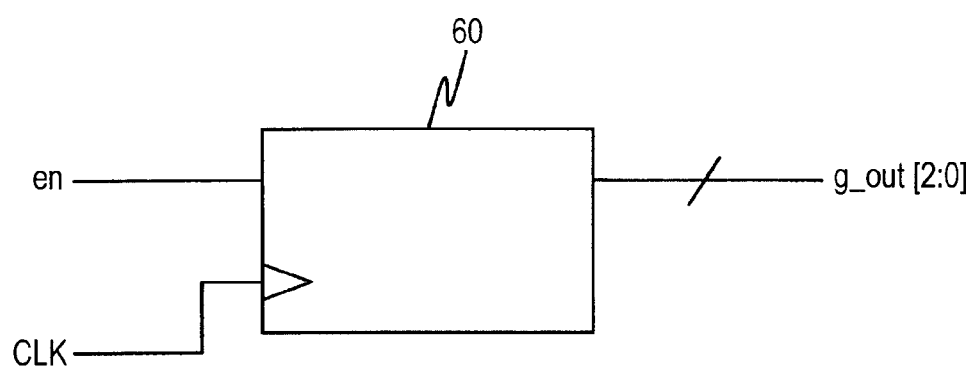
FIG. 3 is a configuration diagram of a 3-bit gray code counter.

Next, a specific example of an operation of the static verification device 100 will be described. Hereinafter, a case will described in which 3-bit gray code counter is described in the circuit description 51. FIG. 3 is a configuration diagram of the 3-bit gray code counter 60. An enable signal en and a clock signal CLK are inputted into the gray code counter 60. The gray code counter 60 counts up or counts down an output g_out[2:0] in synchronization with the clock signal CLK in accordance with the enable signal en. For example, when the enable signal is "1", the gray code counter 60 performs a count-up operation. On the other hand, when the enable signal is "0", the gray code counter 60 performs a count-down operation.

Property of the static verification of the gray code counter 60 is set to "eventually a state is reached in which the counter holds a value of 110". As an initial state, "a state in which the counter holds a value of 000" is set. The static verification unit 1 performs static verification on the basis of the property and the initial state.

Figure 4:
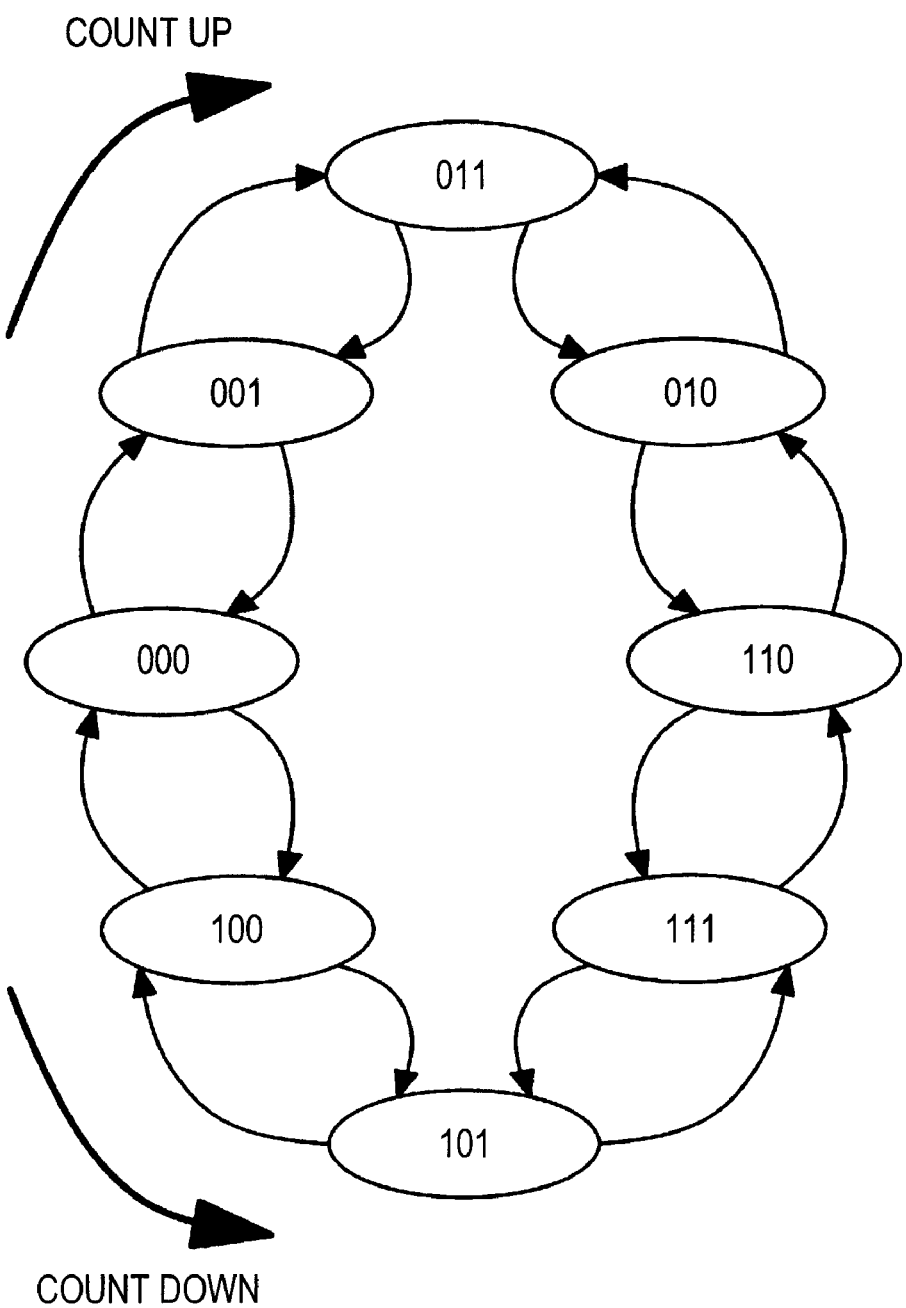
FIG. 4 is a state transition diagram of the gray code counter.

FIG. 4 is a state transition diagram of the gray code counter 60. Since the gray code counter 60 is a 3-bit gray code counter, the reachable number of states is "8". For example, when the gray code counter 60 counts up, the output g_out [2:0] sequentially changes from 000 to 001 to 011 to 010 to 110 to 111 to 101 to 100 to 000 to and so on.

Figure 5:
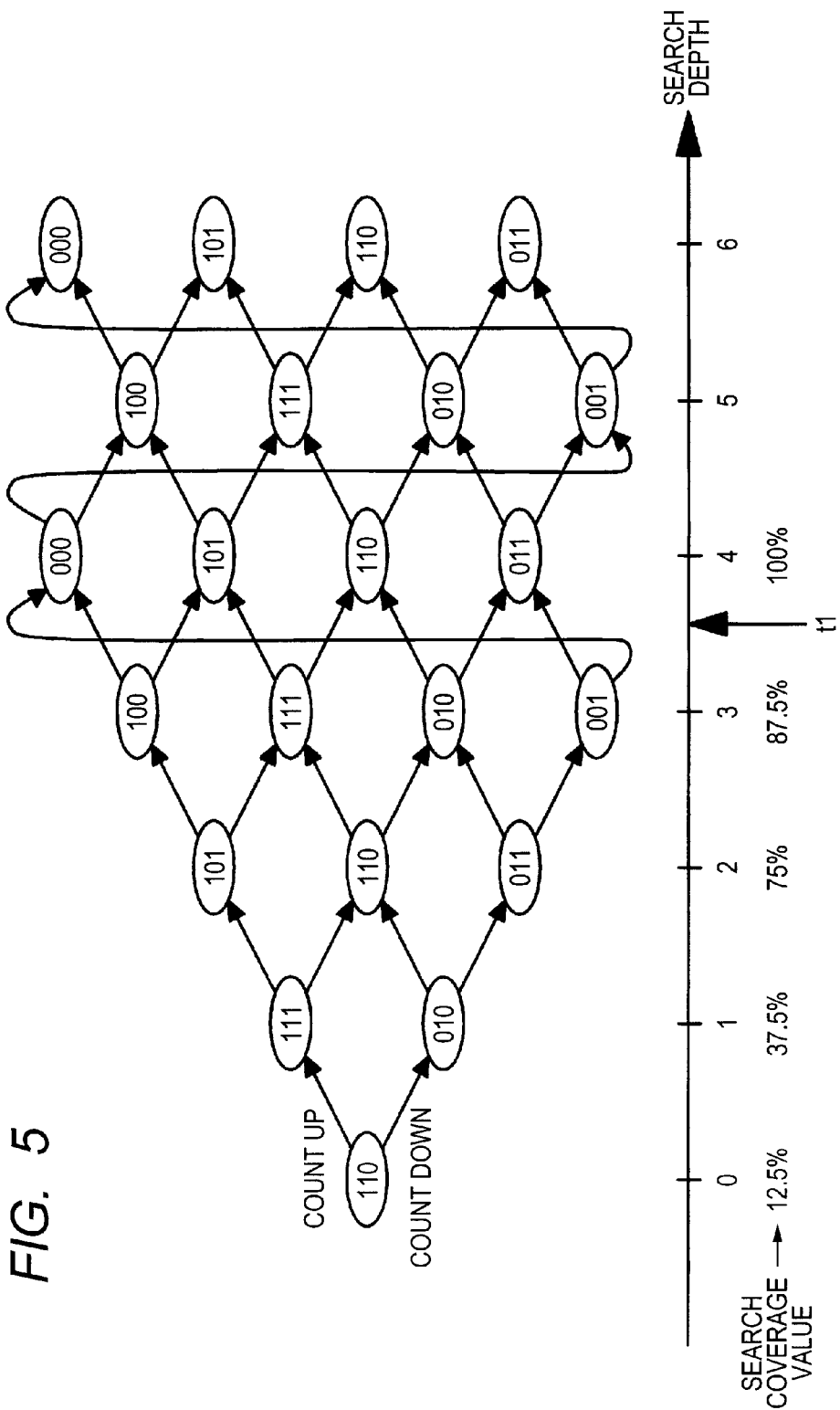
FIG. 5 is a diagram showing a temporal logic of the gray code counter.

FIG. 5 is a diagram showing a temporal logic of the gray code counter 60. The horizontal axis in FIG. 5 indicates the search depth. In FIG. 5, as a result of the state transition from the starting point "110", the initial state "000" is reached at the time point of search depth "4". Therefore, it is known that the gray code counter 60 satisfies the property "eventually a state is reached in which the counter holds a value of 110".

The search coverage value calculator 2 calculates a search coverage value according to the search depth of the static verification. In FIG. 5, the search coverage value corresponding to the search depth is shown in percentage. As the search depth increases, the reached state increases, and in FIG. 5, the search coverage value reaches 100% at the time point when the search in the search depth "4" is completed. Therefore, a further search is not necessary, so that the search is ended. In this case, it is known that the given property is satisfied at the search depth "4".

If the time limit is set at a time point before the search depth reaches "4", the static verification unit 1 ends the verification at a time point when the time limit is reached. For example, if the time limit is reached at the time t1 in FIG. 5, the static verification unit 1 forcibly terminates the verification at the search depth "3" without obtaining a verification result.

According to the static verification device 100, in the static verification of the above-described gray code counter 60, a user of the static verification device 100 can observe the progress state of the static verification by referring to the search coverage value of the static verification.

Second Embodiment

Figure 6:
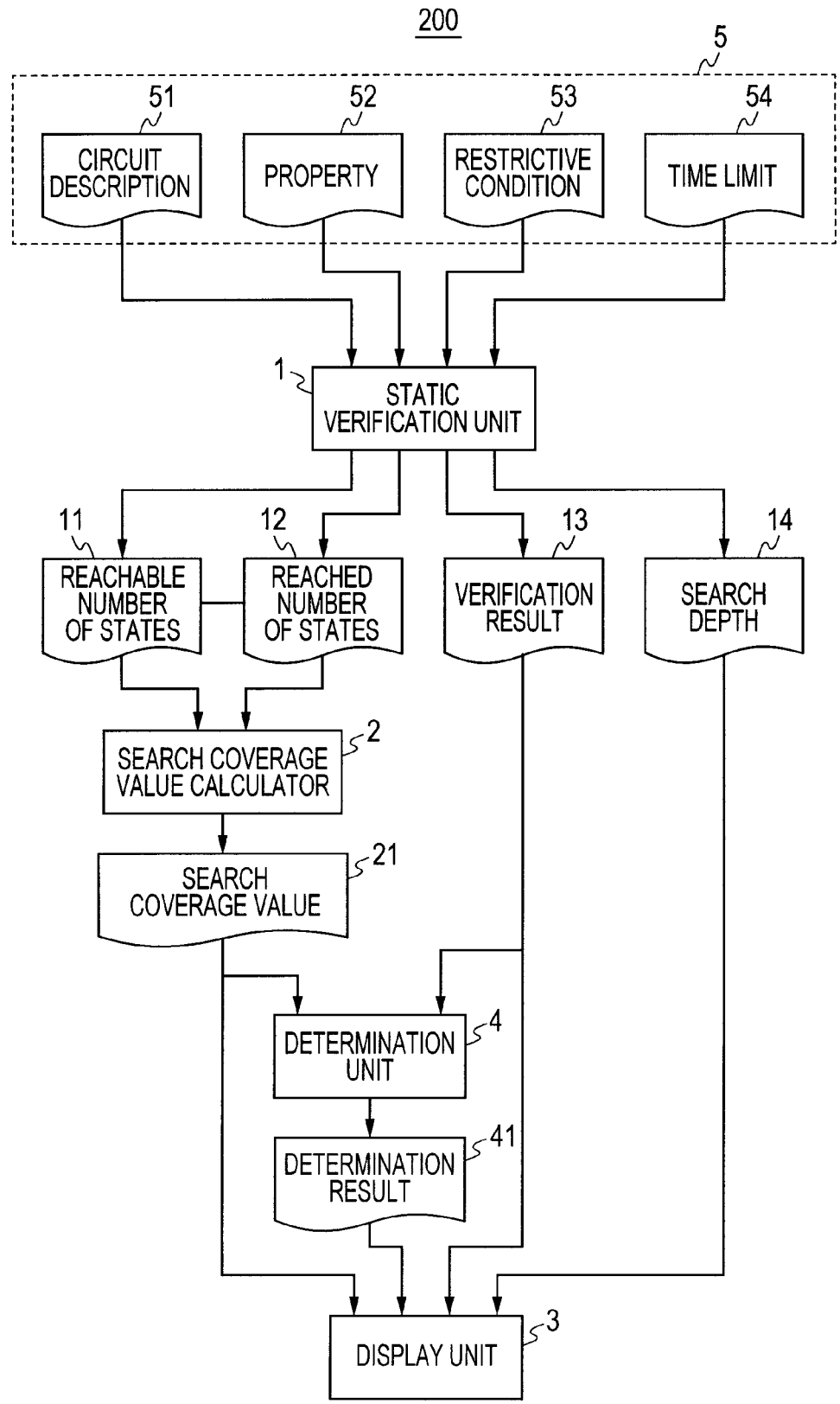
FIG. 6 is a configuration diagram of a static verification device according to a second embodiment.

Next, a static verification device according to a second embodiment will be described. The static verification device 200 according to the second embodiment is a device in which a determination unit 4 that determines a value of the search coverage value 21 is added to the above-described static verification device 100. FIG. 6 is a configuration diagram of the static verification device 200. As shown in FIG. 6, the determination unit 4 of the static verification device 200 outputs a determination result to the display unit 3 in accordance with the search coverage value and the verification result. The other configuration of the static verification device 200 is the same as that of the static verification device 100, so that the description thereof will be omitted.

Figure 7:
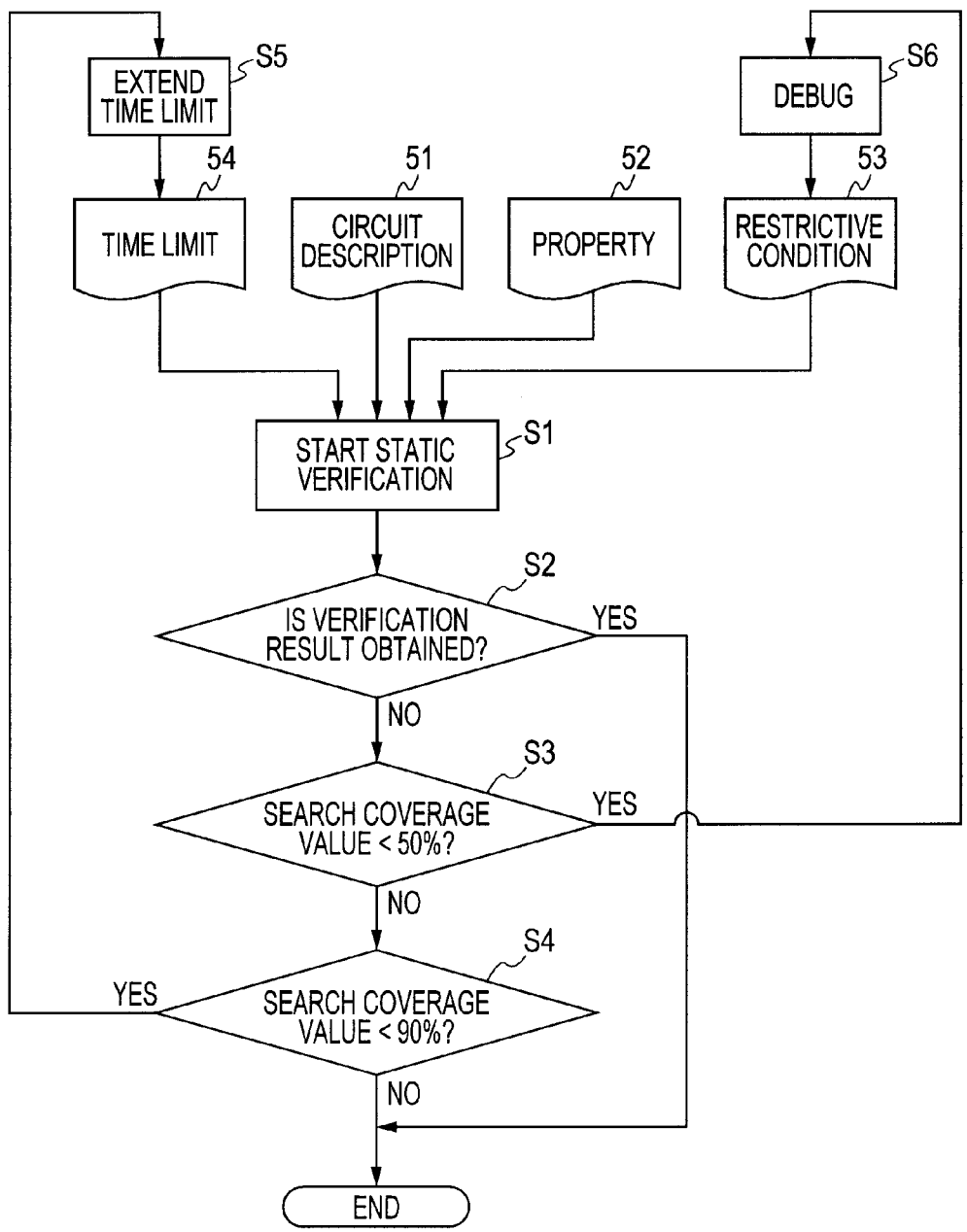
FIG. 7 is a diagram showing an example of a processing flow of static verification performed by the static verification device.

Next, an operation of the static verification device 200 will be described. FIG. 7 is a flowchart showing an example of a processing flow of the static verification performed by the static verification device 200.

First, the static verification unit 1 starts the static verification on the basis of the circuit description 51, the property 52, the restrictive condition 53, and the time limit 54 (step S1). After the start of the static verification, the search coverage value calculator 2 calculates the search coverage value 21 according to the search depth of the static verification. If the verification result 13 can be obtained within the time limit 54, in other words, if the search coverage value 21 reaches 100% or if it is known that the property is satisfied, the verification is ended (step S2).

Third Embodiment

Next, a static verification device according to a third embodiment will be described. The static verification device according to the third embodiment is a device in which a function for detecting saturation of the search coverage value is added to the above-described static verification device 100.

In the static verification device according to the third embodiment, the search coverage value calculator 2 monitors a variation amount of the search coverage value in a certain clock cycle period $\Delta t$. Here, a standard value is set in the search coverage value calculator 2 in advance. Specifically, when the monitored variation amount of the search coverage value is smaller than a standard value $\Delta C$, it is determined that the search coverage value is saturated. Here, the unit of clock cycle period is the same as the unit of search depth.

Figure 8:
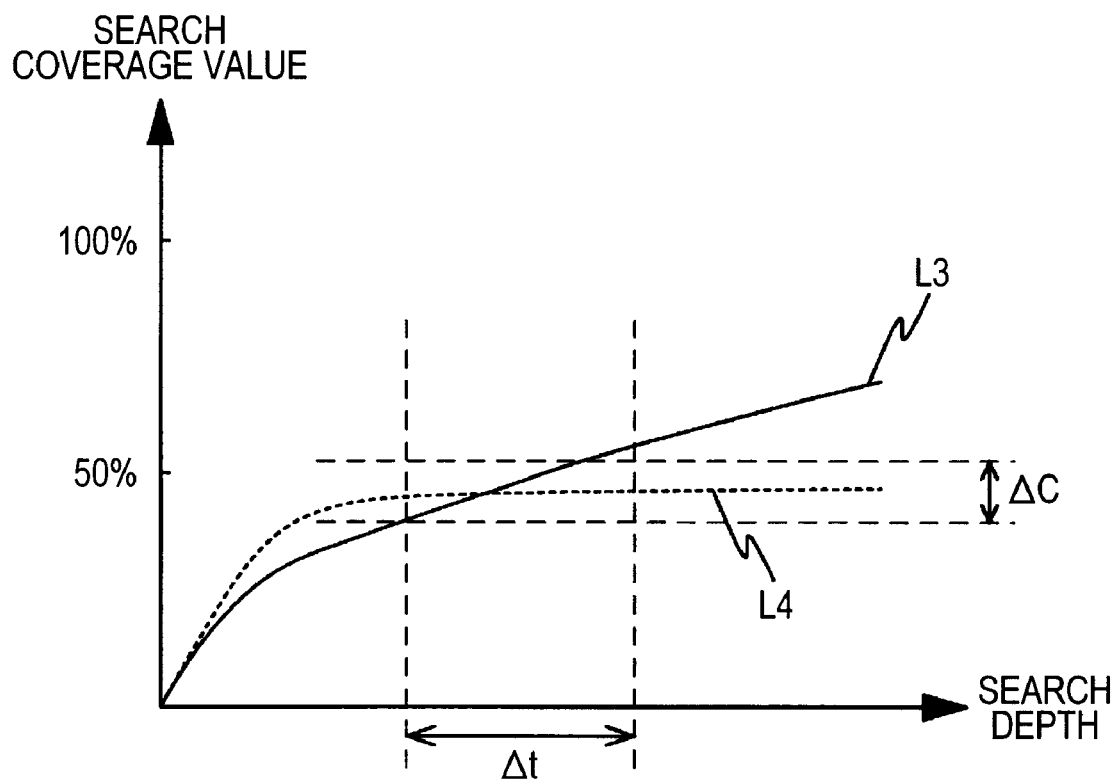
FIG. 8 is a graph showing detection of saturation of a search coverage value in a static verification device according to a third embodiment.

FIG. 8 is a graph showing detection of the saturation of the search coverage value. In the curve L3, the variation amount of the search coverage value in the clock cycle period $\Delta t$ is greater than the standard value $\Delta C$, so that the saturation of the search coverage value is not detected. On the other hand, in the curve L4, the variation amount of the search coverage value in the clock cycle period $\Delta t$ is within the standard value $\Delta C$, so that the saturation of the search coverage value is detected.

When the search coverage value calculator 2 detects the saturation of the search coverage value, the search coverage value calculator 2 outputs the detection result to the display unit 3. The display unit 3 displays the detection result according to the detection result. The user of the static verification device can recognize that the executed static verification is in a saturated state by visually checking the display. Further, the user can determine whether or not the saturated state is appropriate for the circuit.

Other Embodiments

The present invention is not limited to the above-described embodiments, but can be arbitrarily modified without departing from the scope of the invention. For example, although, in the above-described embodiments, the present invention is described as a hardware configuration, the present invention is not limited to this. The present invention can also be implemented by causing a CPU (Central Processing Unit) to execute a computer program.

The above-mentioned program can be stored by using various types of non-transitory computer readable media and provided to a computer. The non-transitory computer readable media include various types of tangible storage media. Examples of the non-transitory computer readable medium include a magnetic recording medium (for example, flexible disk, magnetic tape, and hard disk drive), a magneto-optical recording medium (for example, magneto-optical disk), CD-ROM (Read Only Memory), CD-R, CD-R/W, and a semiconductor memory (for example, mask ROM, PROM (Programmable ROM), EPROM (Erasable PROM), flash ROM, and RAM (random access memory)). The program may be provided to a computer by various types of transitory computer readable media. Examples of the transitory computer readable medium include an electrical signal, an optical signal, and an electromagnetic wave. The transitory computer readable medium can provide a program to a computer via a wired communication path such as an electric wire and an optical fiber or a wireless communication path.

What is claimed is:

1. A non-transitory computer readable medium storing a static verification program causing a computer to execute a process for static verification, the process comprising:
   reading a circuit description and property;
   performing static verification of the circuit description on the basis of the property and calculating the number of states that can be reached in the static verification and the number of states that is reached in accordance with a search depth in the static verification;
   calculating a search coverage value on the basis of the number of states that can be reached and the number of states that is reached;
   making a graph that shows a change in the calculated search coverage value with respect to the search depth;
   detecting a case in which the search coverage value in a predetermined depth range is smaller than a predetermined first value as a case in which the search coverage value is saturated; and
   displaying the search coverage value the graph, and a fact that the search coverage value is saturated in a state in which the search coverage value, the graph, and the fact can be visually checked.

2. The non-transitory computer readable medium storing a static verification program according to claim 1,
   wherein the search coverage value is a ratio between the number of states that can be reached and the number of states that is reached.

3. The non-transitory computer readable medium storing a static verification program according to claim 2,
   wherein the search coverage value is a value obtained by dividing the number of states that is reached by the number of states that can be reached.

4. The non-transitory computer readable medium storing a static verification program according to claim 1, the program causing a computer to execute a process for static verification, the process further comprising:
   reading a time limit of the static verification; and
   forcibly terminating the static verification if the time limit has elapsed since the start of the static verification while verification result cannot be obtained.

5. A static verification device comprising:
   a storage unit that stores a circuit description and property;
   a static verification unit that performs static verification of the circuit description on the basis of the property and calculates the number of states that can be reached in the static verification and the number of states that is reached in accordance with a search depth in the static verification;
   a search coverage value calculator that calculates a search coverage value on the basis of the number of states that can be reached and the number of states that is reached;
   making a graph that shows a change in the calculated search coverage value with respect to the search depth;
   detecting a case in which the search coverage value in a predetermined depth range is smaller than a predetermined first value as a case in which the search coverage value is saturated; and
   a display unit that displays the search coverage value the graph, and a fact that the search coverage value is saturated in a state in which the search coverage value, the graph, and the fact can be visually checked with respect to the search depth.

6. The static verification device according to claim 5,
   wherein the search coverage value is a ratio between the number of states that can be reached and the number of states that is reached.

7. The static verification device according to claim 6,
   wherein the search coverage value is a value obtained by dividing the number of states that is reached by the number of states that can be reached.

8. The static verification device according to claim 5,
   wherein the storage unit further stores a time limit of the static verification, and
   wherein the static verification unit forcibly terminates the static verification if the time limit has elapsed since the start of the static verification while verification result cannot be obtained.

9. A static verification method comprising:
   reading a circuit description and property stored in a storage unit, performing static verification of the circuit description on the basis of the property, and calculating the number of states that can be reached in the static verification and the number of states that is reached in accordance with a search depth in the static verification;
   calculating a search coverage value on the basis of the number of states that can be reached and the number of states that is reached;
   making a graph that shows a change in the calculated search coverage value with respect to the search depth;
   detecting a case in which the search coverage value in a predetermined depth range is smaller than a predetermined first value as a case in which the search coverage value is saturated; and
   displaying the search coverage value, the graph, and a fact that the search coverage value is saturated in a state in which the search coverage value, the graph, and the fact can be visually checked with respect to the search depth.

* * * * *